(12) United States Patent  (10) Patent No.: US 8,050,056 B2
Melaragno et al.  (45) Date of Patent: Nov. 1, 2011

(54) MOUNTING APPARATUS FOR ELECTRONIC COMPONENTS AND METHOD OF ASSEMBLY

(75) Inventors: Michael J. Melaragno, Erie, PA (US); Glenn A. Jessen, Almond, NY (US); Aleksandar Jovanovic, Erie, PA (US); Timothy J. Rozic, Erie, PA (US); Russell C. Fisher, Jr., Erie, PA (US)

(73) Assignee: General Electric Company, Schenectady, NY (US)

( * ) Notice: Subject to any disclaimer, the term of this patent is extended or adjusted under 35 U.S.C. 154(b) by 621 days.

(21) Appl. No.: 12/241,180

(22) Filed: Sep. 30, 2008

(65) Prior Publication Data

US 2009/0257204 A1 Oct. 15, 2009

Related U.S. Application Data

(60) Provisional application No. 61/043,956, filed on Apr. 10, 2008.

(51) Int. Cl.
*H05K 7/04* (2006.01)

(52) U.S. Cl. ......... 361/810; 248/918; 174/254; 362/147

(58) Field of Classification Search ............. 248/346.01, 248/918, 218.4, 284.1, 503; 174/72 A, 254, 174/353; 361/748, 679.01, 679.43, 801, 361/679.57, 747, 679.51, 679.48; 362/650, 362/147, 154, 418, 227, 365; 345/156, 157, 345/175

See application file for complete search history.

(56) References Cited

U.S. PATENT DOCUMENTS

| | | | |
|---|---|---|---|
| 4,032,204 A | 6/1977 | Nation | |
| 4,974,377 A | 12/1990 | Dominitz et al. | |
| 5,751,548 A | 5/1998 | Hall et al. | |
| 5,762,213 A | 6/1998 | Heneveld, Sr. | |
| 5,953,999 A | 9/1999 | Kanehl | |
| 6,935,521 B2 | 8/2005 | Gundlach et al. | |
| 7,134,558 B1 | 11/2006 | Mimlitch, III et al. | |
| 7,170,758 B1 * | 1/2007 | Hanning et al. | 361/801 |
| 7,182,211 B2 | 2/2007 | Ho | |
| 7,293,751 B2 | 11/2007 | Eriksson | |
| 7,891,630 B2 * | 2/2011 | Lipman et al. | 248/371 |
| 2006/0124072 A1 * | 6/2006 | Conger et al. | 119/417 |

FOREIGN PATENT DOCUMENTS

JP 2001299470 A 10/2001

* cited by examiner

*Primary Examiner* — Hung Duong

(74) *Attorney, Agent, or Firm* — John A. Kramer, Esq.; Armstrong Teasdale LLP

(57) ABSTRACT

A mounting apparatus for electronic components is provided. The mounting apparatus includes a mounting frame including a support portion, backing portion, and lip portion. The backing portion is coupled to a support portion rear end and includes a first segment and a second segment, wherein the second segment is oriented perpendicular to the support portion and the first portion. The lip portion is coupled to a support portion front end such that the support portion and the lip portion define a plurality of slots extending therethrough. The mounting apparatus also includes a plurality of tee bolts each including a first portion and a second portion extending perpendicularly through the first portion, wherein the first portion is removably inserted into a slot. The mounting apparatus also includes a plurality of locating pins that are inserted into a threaded hole extending through the backing portion second segment.

20 Claims, 11 Drawing Sheets

MOUNTING APPARATUS FOR ELECTRONIC COMPONENTS AND METHOD OF ASSEMBLY

CROSS REFERENCE TO RELATED APPLICATIONS

This application claims the benefit of U.S. Provisional Application No. 61/043956 filed Apr. 10, 2008, which is hereby incorporated by reference in its entirety.

BACKGROUND OF THE INVENTION

The subject matter disclosed herein relates generally to electronic components and, more specifically, to an adjustable mounting apparatus for use with electronic components.

At least some known electronic components are mounted using a rigid mounting frame that was designed and built according to specific dimensions associated with a particular device and/or a class of device. As a result, the number of unique mounting frames needed to mount necessary electronic components may be numerous. Moreover, at least some known mounting frames can only accommodate a single electronic component and/or a single type or model of electronic component, thus further increasing the number of mounting frames needed to mount necessary electronic components. However, using a large number of mounting frames increases an amount of space needed. In addition, at least some known vehicles, such as motor vehicles, aircraft, locomotives, and the like, require multiple electronic devices to monitor engine statuses, fuel supplies, and the like. Such vehicles may have only limited space in which to mount such electronic devices. As such, it has become increasingly difficult to fit the different necessary mounting frames in the available space. Accordingly, an electronic component mounting apparatus that enables mounting a varying number and types of electronic components using hand tools and removable hardware is desirable.

BRIEF DESCRIPTION OF THE INVENTION

In one aspect, a mounting apparatus for electronic components is provided. The mounting apparatus includes a mounting frame including a support portion, backing portion, and lip portion. The backing portion is coupled to a support portion rear end and includes a first segment and a second segment, wherein the second segment is oriented perpendicular to the support portion and the first portion. The lip portion is coupled to a support portion front end such that the support portion and the lip portion define a plurality of slots extending therethrough. The mounting apparatus also includes a plurality of tee bolts each including a first portion and a second portion extending perpendicularly through the first portion, wherein the first portion is removably inserted into a slot. The mounting apparatus also includes a plurality of locating pins that are inserted into a threaded hole extending through the backing portion second segment.

In another aspect, a method of assembling a mounting apparatus for use with electronic components is provided. The method includes coupling a backing portion of a mounting frame to a rear end of a support portion of the mounting frame, wherein the backing portion includes a first segment and a second segment that is oriented perpendicular to the support portion and to the first segment. The method also includes inserting a tee bolt first portion into a slot defined in a lip portion of the mounting frame, and inserting a locating pin first end into a corresponding threaded hole extending through the second segment of the backing portion.

In another aspect, a mounting apparatus is provided for supporting electronic components. The mounting apparatus includes a mounting frame including a support portion, a backing portion, and a lip portion, each integrally formed to each other. The support portion includes a front end, an opposite rear end, and a plurality of mounting holes extending through the support portion to facilitate securing the mounting apparatus to a rack. The backing portion includes a first segment and a second segment that is oriented perpendicular to the support portion and to the first portion. The second segment includes a plurality of threaded holes extending therethrough and a compression material. The lip portion formed and the support portion define a plurality of slots extending therethrough. The mounting apparatus also includes a plurality of tee bolts each including a first portion and a second portion extending perpendicularly through the first portion. The first portion is removably inserted in one of the plurality of slots. The mounting apparatus also includes a plurality of locating pins each having a first end removably inserted in one of the plurality of threaded holes extending through the backing portion second segment.

DETAILED DESCRIPTION OF THE INVENTION

As used herein, the term "electronic components" refers to components for use in vehicles, such as, but not limited to, automotive vehicles, locomotives, water-borne vehicles, and/or airborne vehicles. Such components may monitor operating conditions within the vehicles, communicate with internal and/or external controllers, or any other suitable operation. As such, the terms "electronic device," "electrical component," and "electrical device" should be understood to be synonymous with the term "electronic component."

Figure 2:
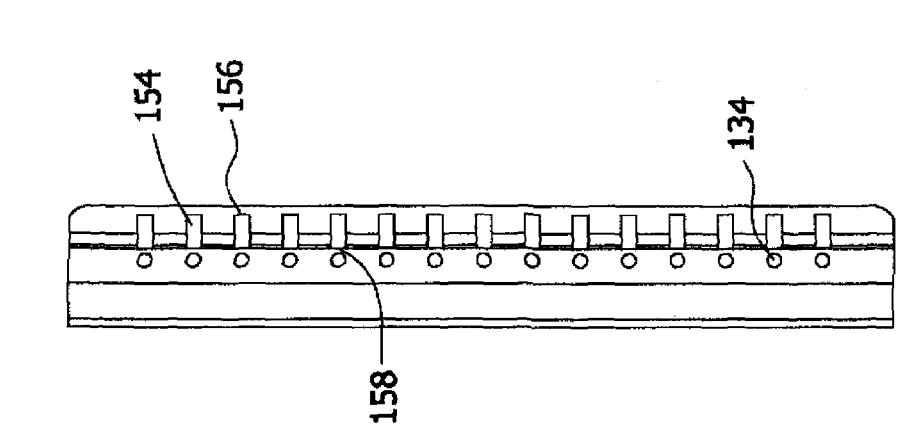
FIG. 2 is a front view of the mounting frame shown in FIG. 1.
Figure 1:
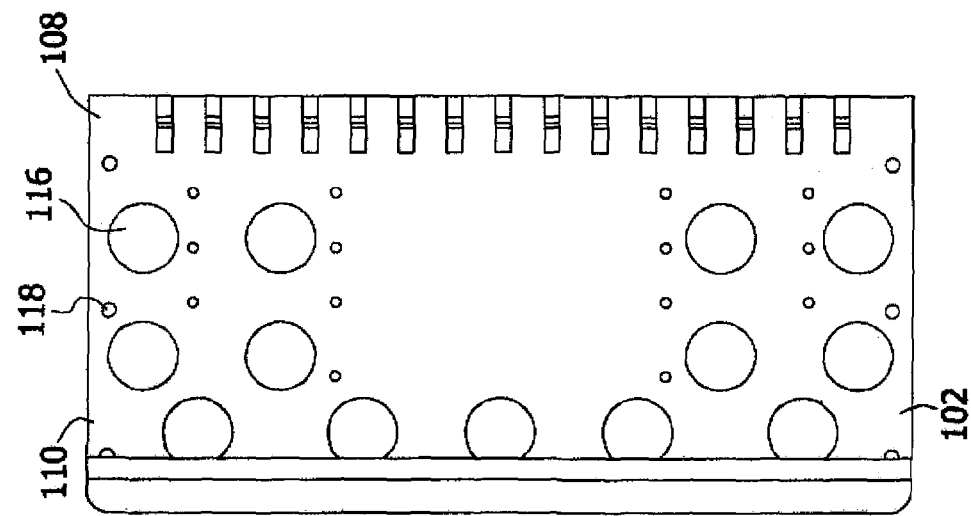
FIG. 1 is a top view of an exemplary mounting frame.
Figure 3:
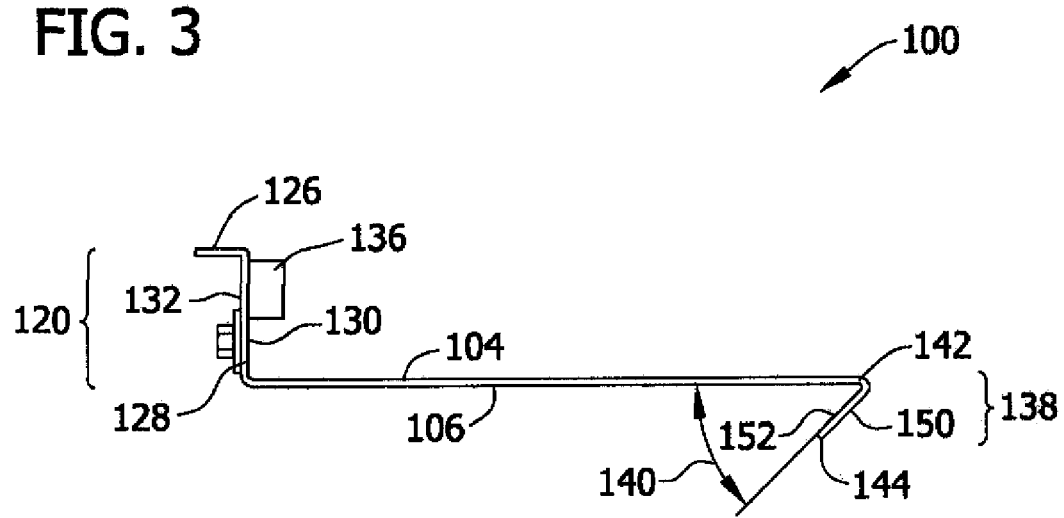
FIG. 3 is a side view of the mounting frame shown in FIG. 1.
Figure 4:
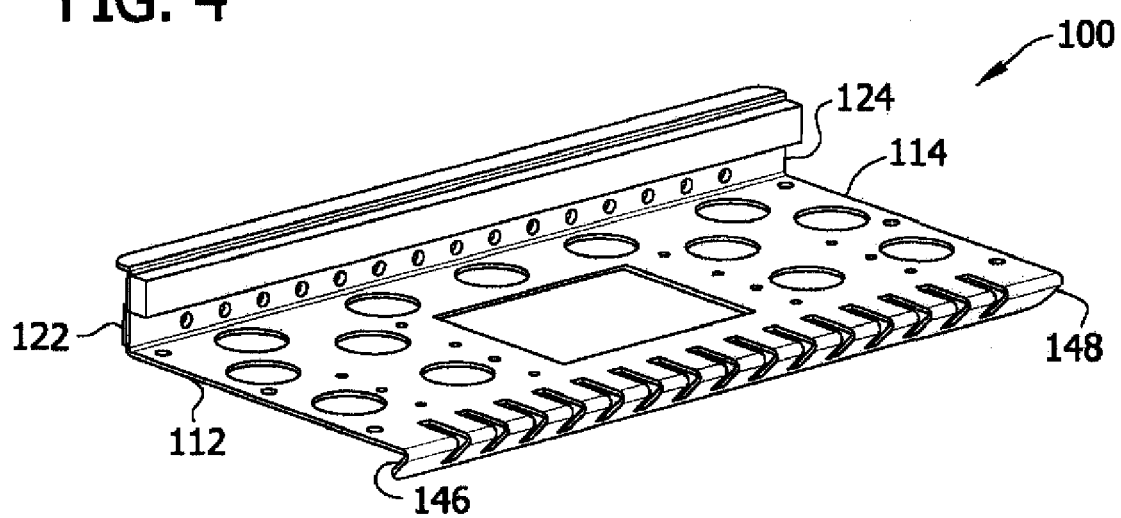
FIG. 4 is a perspective view of the mounting frame shown in FIG. 1.

FIGS. 1-4 are schematic diagrams of an exemplary mounting frame 100. Specifically, FIG. 1 is a top view of frame 100 and FIG. 2 is a front view of frame 100. Moreover, FIG. 3 is a side view of frame 100, and FIG. 4 is a perspective view of frame 100.

In the exemplary embodiment, frame 100 includes a support portion 102 for use in supporting one or more electronic components (not shown in FIGS. 1-4). Support portion 102 includes a top surface 104, a bottom surface 106, a front end 108, a rear end 110, a first side edge 112, and a second side edge 114 that is opposite first side edge 112. Support portion 102 also includes a plurality of vent holes 116 that extend through support portion 102 to facilitate cooling the electronic components as described in more detail below. Support portion 102 also includes a plurality of mounting holes 118 extending through support portion 102. Holes 118 facilitate attaching frame 100 to an equipment rack (not shown).

In the exemplary embodiment, frame 100 also includes a backing portion 120. More specifically, in the exemplary embodiment, backing portion 120 is coupled, such as welded, to support portion rear end 110. In an alternative embodiment, backing portion 120 is formed integrally with support portion rear end 110. Moreover, in the exemplary embodiment, backing portion 120 includes a first side edge 122, a second side edge 124 opposite first side edge 122, a first segment 126, and a second segment 128 oriented perpendicular to first segment 126. As such, in the exemplary embodiment, first segment 126 is oriented substantially parallel to support portion 102. Second segment 128 includes a front surface 130 and a rear surface 132. Moreover, first side edge 122 is continuous with support portion first side edge 112 and, similarly, second side edge 124 is continuous with support portion second side edge 114. Backing portion 120 also includes a plurality of threaded holes 134 extending therethrough. In one embodiment, backing portion 120 also includes a compression material 136 to facilitate reducing shock and/or vibrational forces induced to the;.electronic components and to create a thread-locking force between a tee-bolt and nut an a front surface of the electronic components, as described in more detail below.

Moreover, in the exemplary embodiment, frame 100 also includes a lip portion 138 that is coupled, such as welded, to support portion front end 108. In an alternative embodiment, lip portion 138 is formed integrally with support portion front end 108. More specifically, in the exemplary embodiment, lip portion 138 is coupled to support portion front end 108 at an acute angle 140, such as approximately 45.0°. Alternatively, lip portion 138 may be oriented at different angles greater than or less than approximately 45.0° relative to support portion 102. Lip portion 138 includes a top edge 142, a bottom edge 144 that is opposite top edge 142, a first side edge 146, a second side edge 148 that is opposite first side edge 146, a front surface 150, and a rear surface 152 that is opposite front surface 150. As such, in the exemplary embodiment, first side edge 146 is continuous with support portion first side edge 112 and, similarly, second side edge 148 is continuous with support portion second side edge 114.

Further, in the exemplary embodiment, support portion 102 and lip portion 138 include a plurality of slots 154 defined therein. More specifically, each slot 154 extends through support portion 102 from front end 108 towards rear end 110, and extends through lip portion 138 from top edge 142 towards bottom edge 144. As such, in the exemplary embodiment, each slot 154 extends continuously from a first end 156 in lip portion 138 to an opposite second end 158 in support portion 102.

Figure 5:
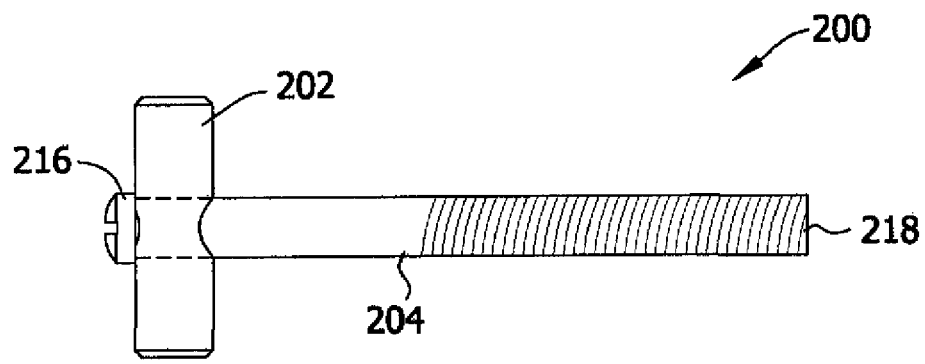
FIG. 5 is a side view of an exemplary tee bolt that may be used with the mounting frame shown in FIGS. 1-4.
Figure 6:
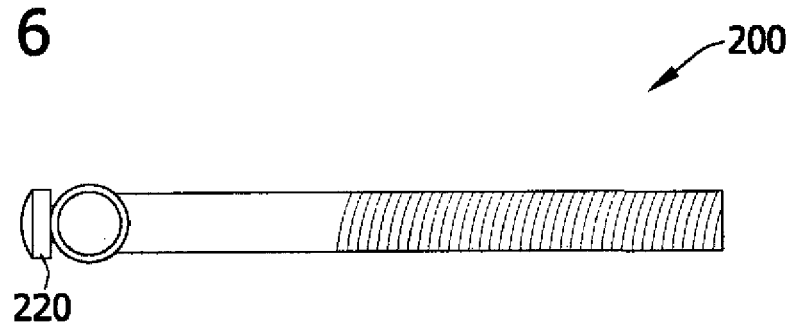
FIG. 6 is a top view of the tee bolt shown in FIG. 5.
Figure 7:
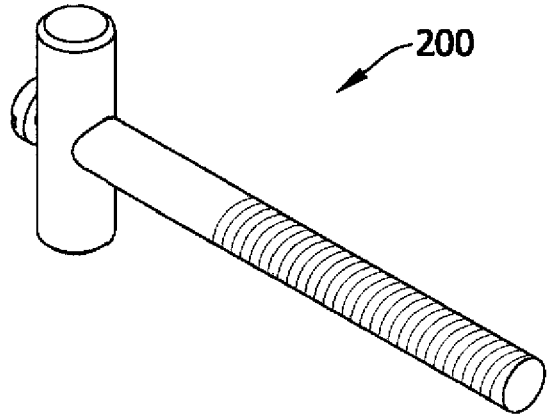
FIG. 7 is a perspective view of the tee bolt shown in FIG. 5.
Figure 8:
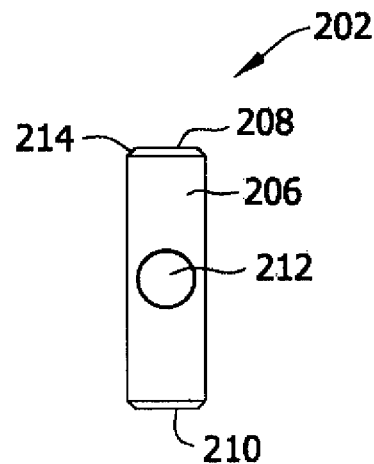
FIG. 8 is a rear view of the tee bolt shown in FIG. 5.

FIGS. 5-7 are schematic diagrams of an exemplary tee bolt 200 that may be used with mounting frame 100 (shown in FIGS. 1-4). Specifically, FIG. 5 is a side view of tee bolt 200. FIG. 6 is a top view of tee bolt 200, and FIG. 7 is a perspective view of tee bolt 200.

In the exemplary embodiment, tee bolt 200 includes a first portion 202 and a second portion 204. First portion 202 (also shown in FIG. 83 is substantially cylindrical and includes an outer surface 206, a top surface 208, a bottom surface 210, and a hole 212 that extends therethrough. First portion 202 also includes a chamfer 214 that extends between top surface 208 and outer surface 206, and between bottom surface 210 and outer surface 206. Second portion 204 includes a first end 216 and a second end 218 opposite first end 216. First end 216 includes a head 220. Second portion 204 is threaded from second portion second end 218, at least partially along second portion 204, towards second portion first end 216 in one embodiment, second portion second end 218 is removably coupleable within hole 212. Other embodiments fixedly couple first portion 202 and second portion 204 by, such as, but not limited to, welding, an adhesive means, or any other suitable joining means.

Figure 9:
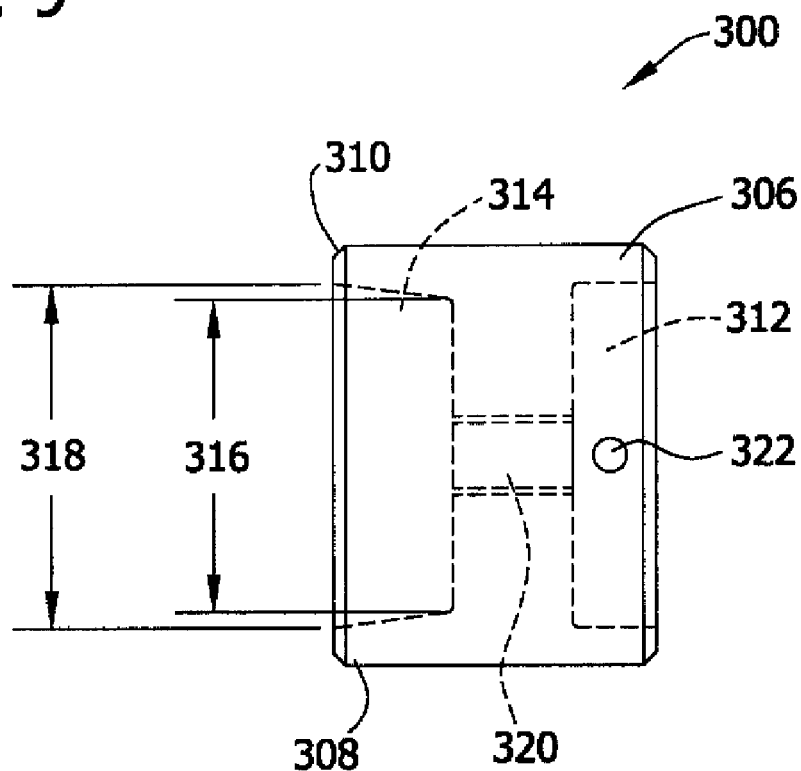
FIG. 9 is a schematic diagram of an exemplary nut that may be used with the tee bolt shown in FIGS. 5-8.
Figure 10:
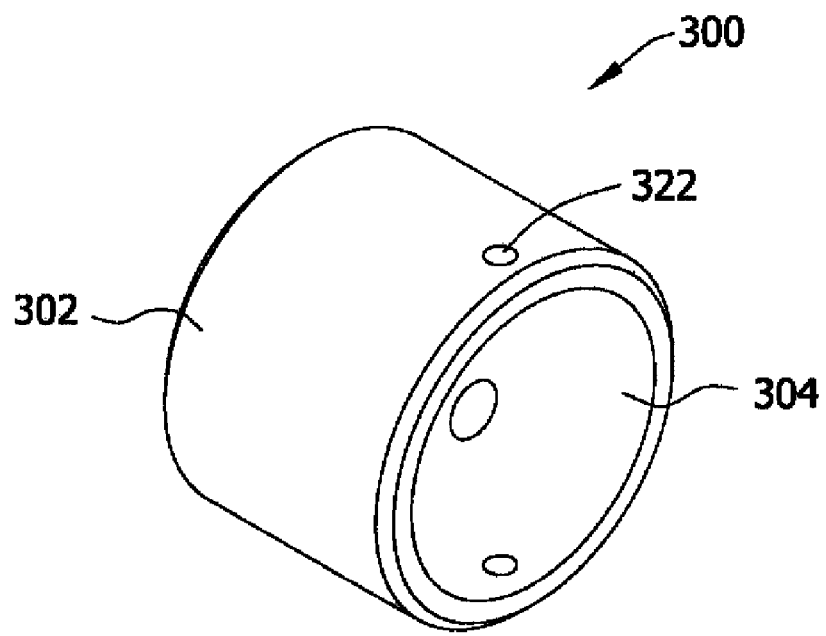
FIG. 10 is a perspective view of the nut shown in FIG. 9.

FIGS. 9 and 10 are schematic diagrams of an exemplary nut 300 that may be used with tee bolt 200 (shown in FIGS. 5-8) and mounting frame 100 (shown in FIGS. 1-4). Specifically, FIG. 9 is a schematic diagram of nut 300, and FIG. 10 is a perspective view of nut 300.

In the exemplary embodiment, nut 300 is substantially cylindrical and includes a knurled outer surface 302, an inner surface 304, a first end 306, and a second end 308 that is opposite first end 306. Nut 300 also includes a chamfer 310 that extends between first end 306 and outer surface 302 and between second end 308 and outer surface 302. Moreover, nut 300 is formed with a first recessed area 312. More specifically, first recessed area 312 is defined within first end 306 and has a substantially cylindrical shape. In one embodiment, nut 300 also includes a second recessed area 314 that is defined within second end 308 and that has an outer diameter 316 and an inner diameter 318 that is smaller than outer diameter 316. Alternative embodiments may have a different shaped second recessed area 314. The shape of second recessed area 314 may be formed to engage an oppositely shaped part on the electronic components to facilitate securing the electronic components on mounting frame 100 (shown in FIG. 1). First recessed area 312 and second recessed area 314 are coupled in flow communication via an opening 320 that extends through nut 300 from first end 306 to second end 308. Opening 320 is threaded and is sized to receive tee bolt second portion second end 218 therein (shown in FIGS. 5-7). In the exemplary embodiment, first recessed area 312 includes two pin holes 322 that are aligned substantially opposite to each other. More specifically, each pin hole 322 extends from outer surface 302 through inner surface 304.

Figure 11:
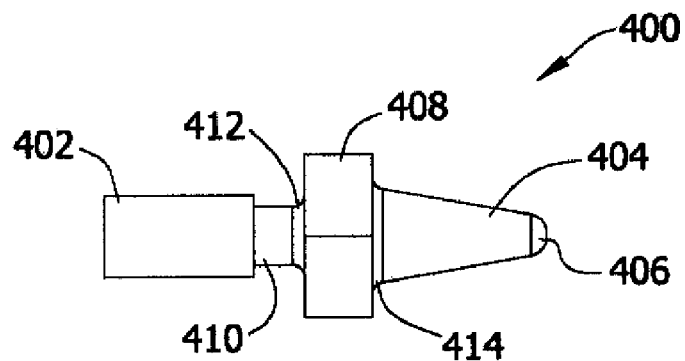
FIG. 11 is a side view of an exemplary locating pin that may be used with the mounting frame shown in FIGS. 1-4.
Figure 13:
FIG. 13 is a perspective view of the locating pin shown in FIG. 11.
Figure 12:
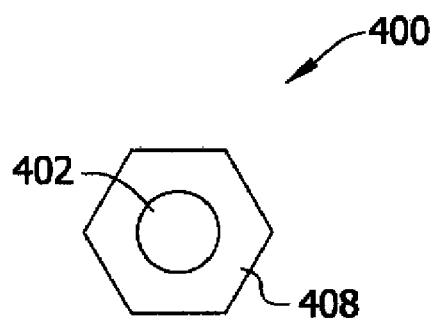
FIG. 12 is a rear view of the locating pin shown in FIG. 11.

FIGS. 11-13 are schematic diagrams of an exemplary locating pin 400 that may be used with mounting frame 100 (shown in FIGS. 1-4). Specifically, FIG. 11 is a side view of locating pin 400, FIG. 12 is a rear view of locating pin 400, and FIG. 13 is a perspective view of locating pin 400.

In the exemplary embodiment, locating pin 400 is formed with a first end 402 and an opposite second end 404. First end 402 is threaded and is conformed to threadably couple to mounting frame holes 134 (shown in FIGS. 1-4). Moreover, first end 402 is removeably coupleable to backing portion 120 (shown in FIGS. 1-4). In the exemplary embodiment, second end 404 is conical and includes a rounded tip 406. Locating pin 400 also includes a nut 408 that is positioned adjacent to second end 404, and a relief portion 410 that is defined between first end 402 and nut 408. A first fillet 412 is defined between nut 408 and relief portion 410, and a second fillet 414 is defined between nut 408 and second end 404.

Figure 15:
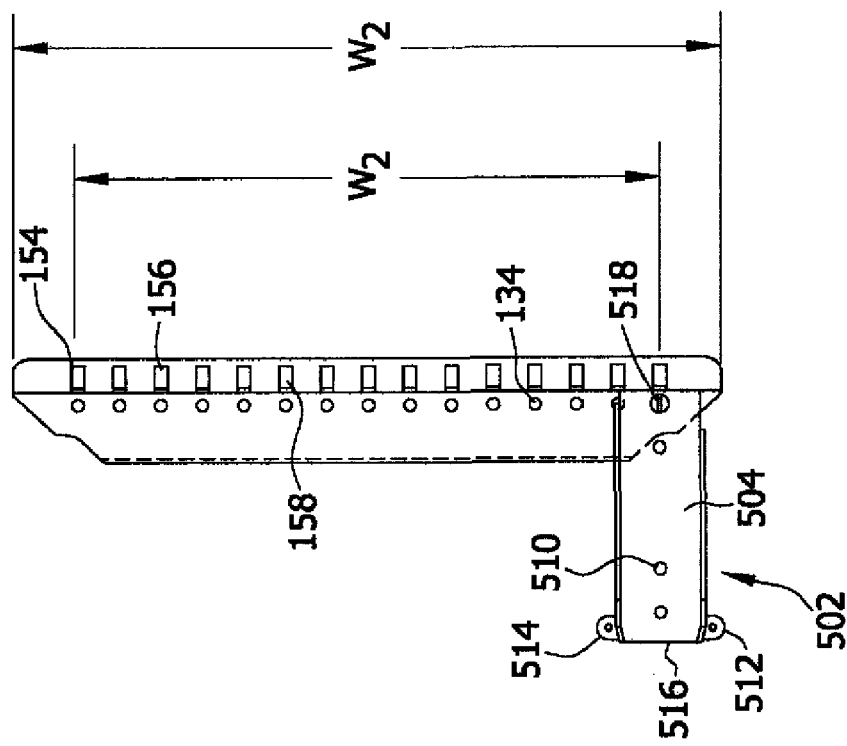
FIG. 15 is a front view of the mounting frame shown in FIG. 14.
Figure 14:
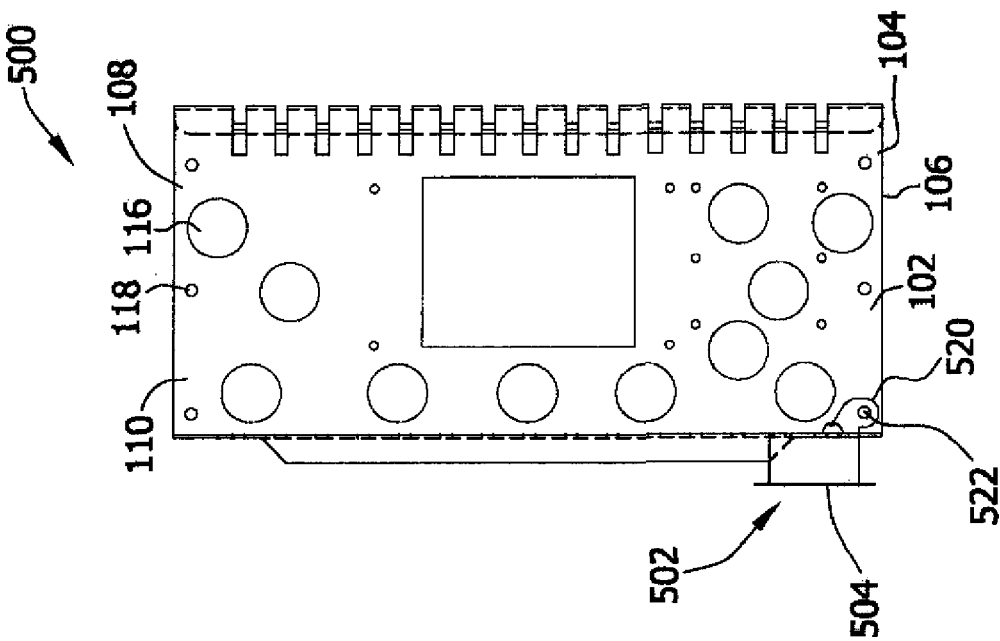
FIG. 14 is a top view of a second exemplary mounting frame.
Figure 16:
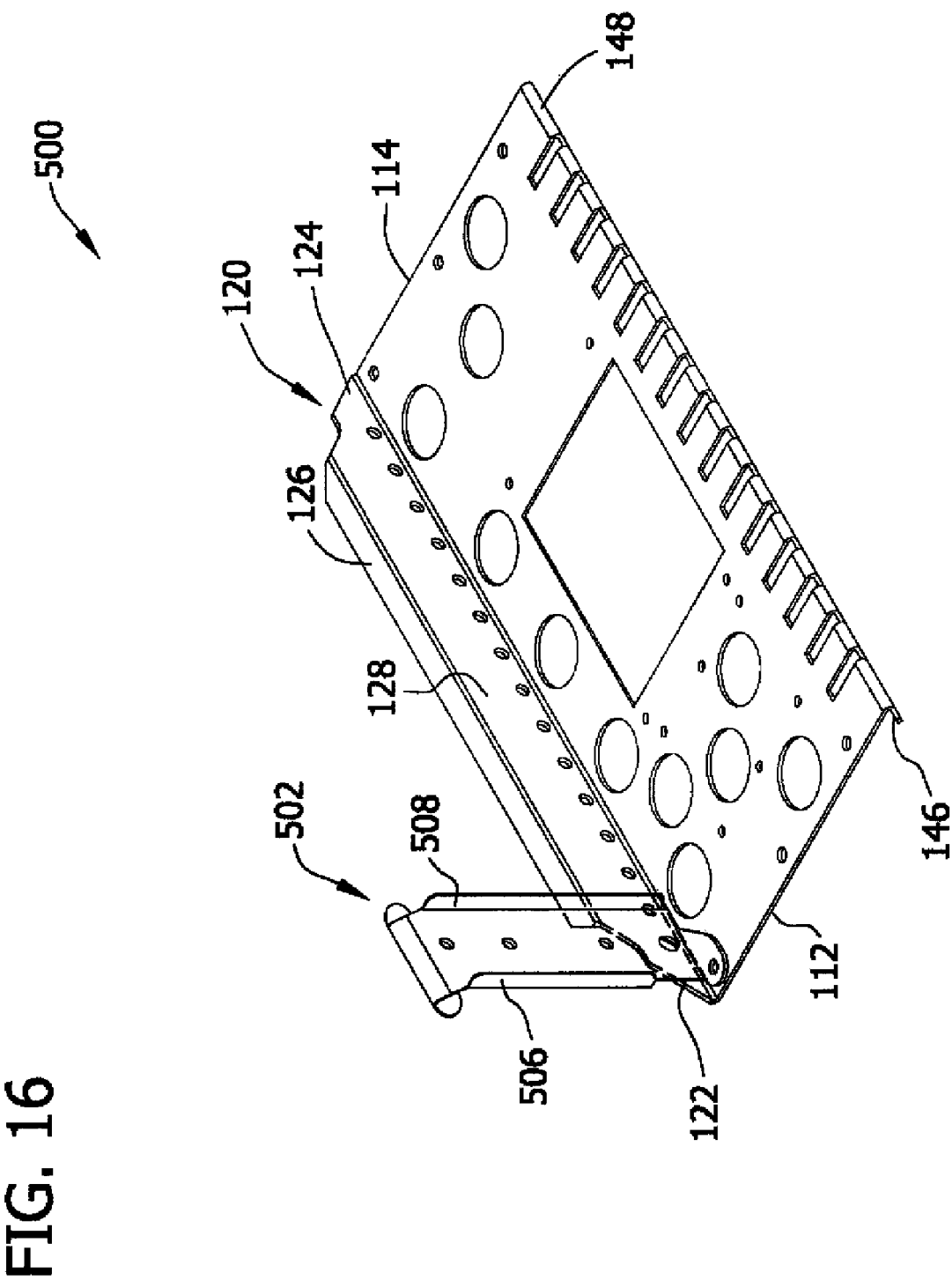
FIG. 16 is a perspective view of the mounting frame shown in FIG. 14.

FIGS. 14-16 are schematic diagrams of a second exemplary mounting frame 500. Specifically, FIG. 14 is a top view of frame 500, FIG. 15 is a front view of frame 500, and FIG. 16 is a perspective view of frame 500. Elements in frame 500 identical to elements of frame 100 (shown in FIGS. 1-4), are identified in FIGS. 14-16 using the same reference numerals as used in FIGS. 1-4.

In the exemplary embodiment, frame 500 includes support portion 102 for use in supporting one or more electronic components (not shown in FIGS. 14-16). Support portion 502 includes top surface 104, bottom surface 106, front end 108, rear end 110, first side edge 112, and second side edge 114 that is opposite first side edge 112. Support portion 102 also includes vent holes 116 that extend through support portion 102 to facilitate cooling the electronic components as described in more detail below. Support portion 102 also includes mounting holes 118 extending through support portion 102. Holes 118 facilitate attaching frame 500 to an equipment rack (not shown).

In the exemplary embodiment, frame 500 also includes backing portion 120. More specifically, in the exemplary embodiment, backing portion 120 is coupled, such as welded, to support portion rear end 110. In an alternative embodiment, backing portion 120 is formed integrally with support portion rear end 110. Moreover, in the exemplary embodiment, backing portion 120 includes first side edge 122, second side edge 124 opposite first side edge 122, first segment 126, and second segment 128 oriented perpendicular to first segment 126. As such, in the exemplary embodiment, first segment 126 is oriented substantially parallel to support portion 102. Second segment 128 includes a front surface (not shown in FIGS. 14-16) and a rear surface (not shown in FIGS. 14-16). Moreover, first side edge 122 is continuous with support portion first side edge 112 and, similarly, second side edge 124 is continuous with support portion second side edge 114. Backing portion 120 also includes threaded holes 134 extending therethrough. In one embodiment, support portion 102 has a width, W1, that is greater than a width, W2, of first segment 126.

To facilitate mounting an electronic component having a smaller width, such as a 1MCU component or a 2MCU component, frame 500 also includes a bracket 502. In the exemplary embodiment, bracket 502 includes a rear wall 504, a first side rail 506, and a second side rail 508 positioned opposite first side rail 506. Each mounting rail 506 and 508 are oriented to secure each side of an appropriately sized electronic component. Moreover, bracket 502 includes a plurality of equipment mounting holes 510 to facilitate coupling an electronic component to rear wall 504. In addition, in the exemplary embodiment, bracket 502 also includes a first mounting extension 512 and an opposite second mounting extension 514, both positioned at a top end 516 of rear wall 504. Each mounting extension 512 and 514 includes an equipment mounting hole 510. Bracket 502 is coupled to backing portion 120 using a fastener, such as a bolt inserted through a mounting hole 518 and an aligned threaded hole 134. The fastener is then secured by, for example, a nut. Moreover, in the exemplary embodiment, bracket 502 includes a mounting plate 520. Mounting plate 520 is coupled to support portion 102 by inserting a fastener, such as a bolt, through a mounting plate hole 522 and an aligned mounting hole 11. The fastener is then secured by, for example, a nut.

Moreover, in the exemplary embodiment, frame 500 also includes lip portion 138 that is coupled, such as welded, to support portion front end 108. In an alternative embodiment, lip portion 138 is formed integrally with support portion front end 108. More specifically, in the exemplary embodiment, lip portion 138 is coupled to support portion front end 108 at an acute angle (not shown in FIGS. 14-16), such as approximately 45.0°. Alternatively, lip portion 138 may be oriented at different angles greater than or less than approximately 45.0° relative to support portion 102. Lip portion 138 includes a top edge (not shown in FIGS. 14-16), a bottom edge (not shown in FIGS. 14-16) that is opposite the top edge, a first side edge 146, a second side edge 148 that is opposite first side edge 146, a front surface (not shown in FIGS. 14-16), and a rear surface (not shown in FIGS. 14-16) that is opposite the front surface. As such, in the exemplary embodiment, first side edge 146 is continuous with support portion first side edge 112 and, similarly, second side edge 148 is continuous with support portion second side edge 114.

Further, in the exemplary embodiment, support portion 102 and lip portion 138 include a plurality of slots 154 defined therein. More specifically, each slot 154 extends through support portion 102 from front end 108 towards rear end 110, and extends through lip portion 138 from top edge 142 towards bottom edge 144. As such, in the exemplary embodiment, each slot 154 extends continuously from a first end 156 in lip portion 138 to an opposite second end 158 in support portion 102.

Figure 17:
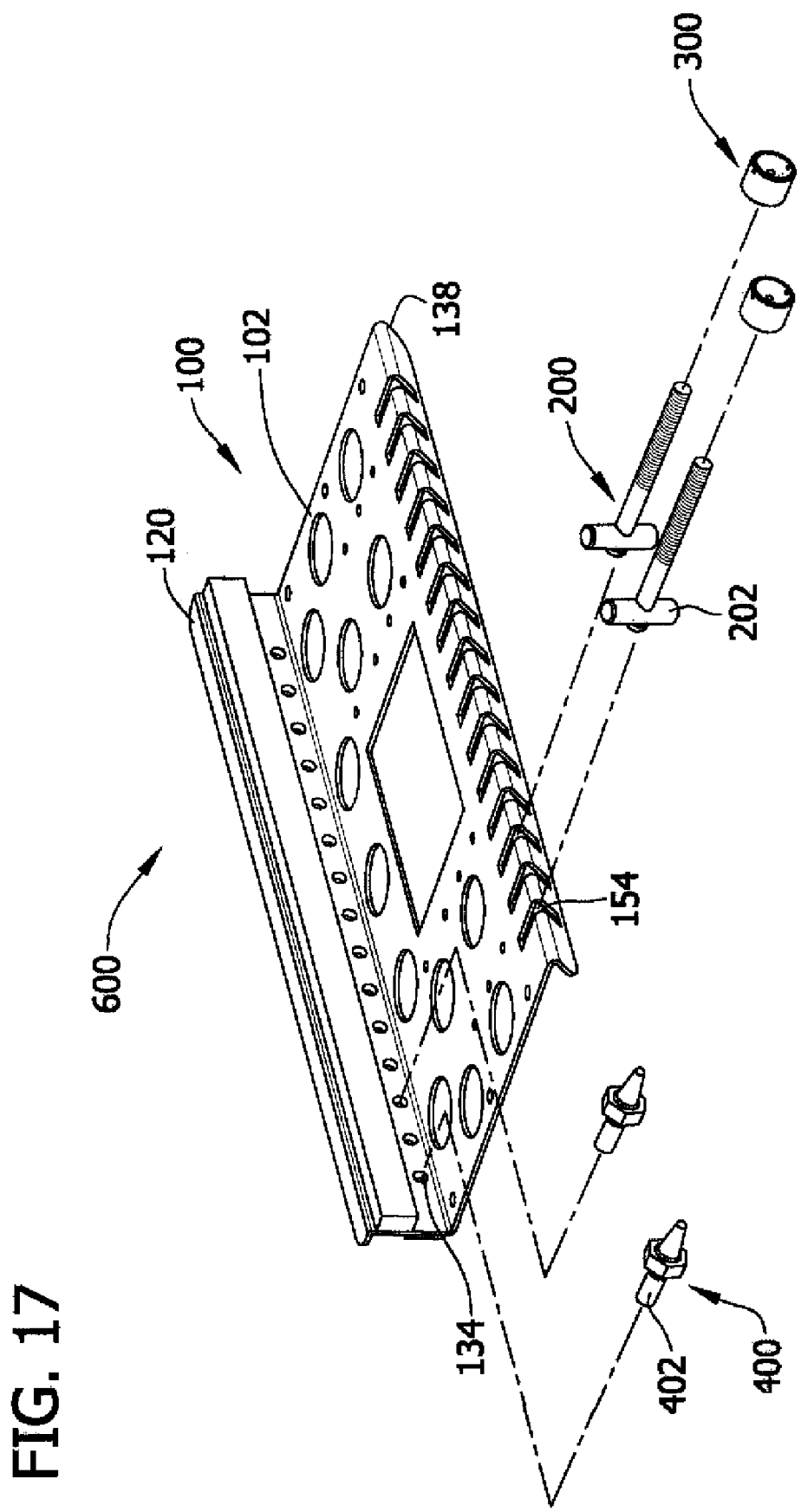
FIG. 17 is a perspective view of an exemplary mounting apparatus that includes the mounting frame shown in FIGS. 1-4, the tee bolt shown in FIGS. 5-8, the nut shown in FIGS. 9 and 10, and the locating pin shown in FIGS. 11-13.
Figure 18:
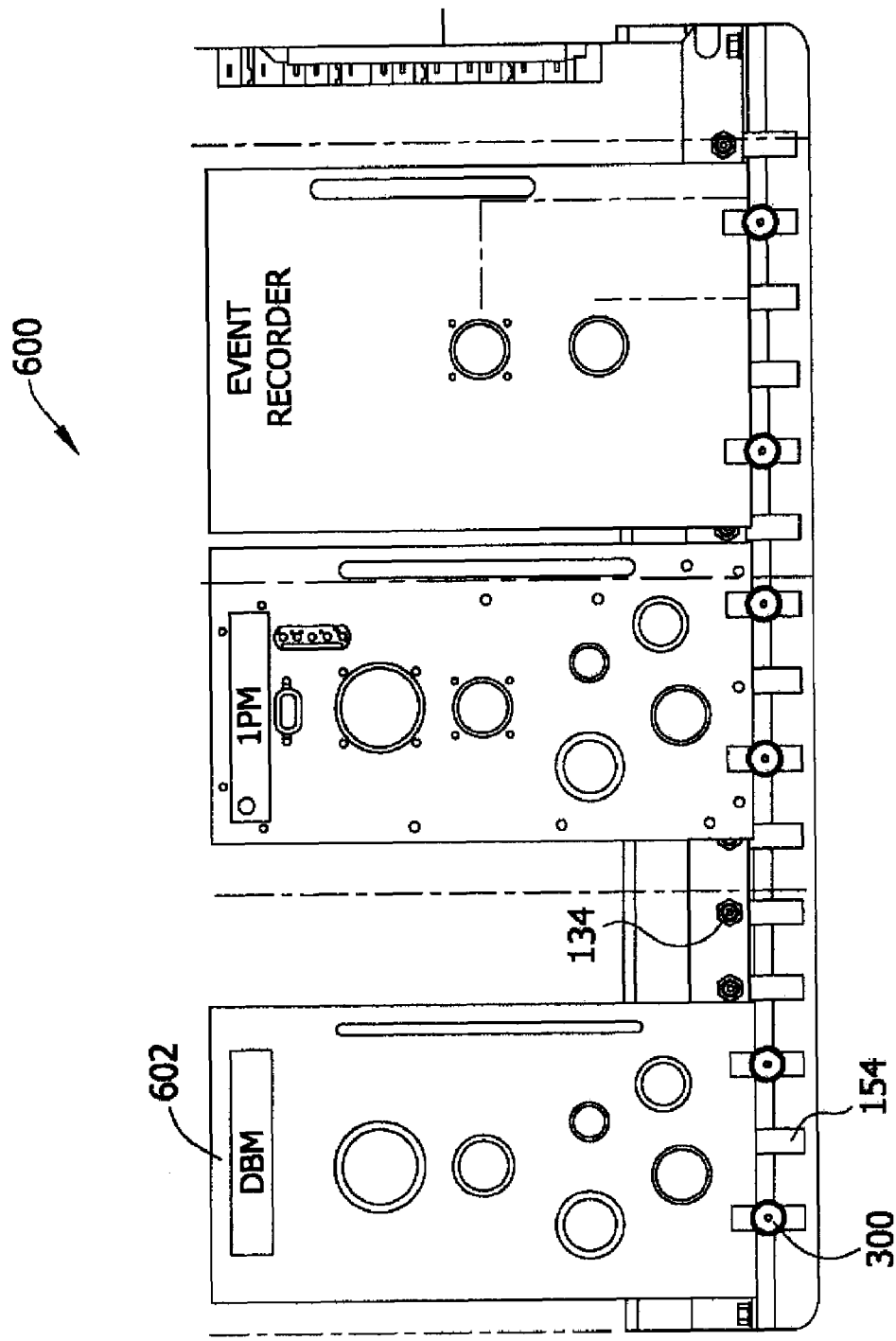
FIG. 18 is a front view of the mounting apparatus shown in FIG. 17, including electronic components mounted thereto.
Figure 19:
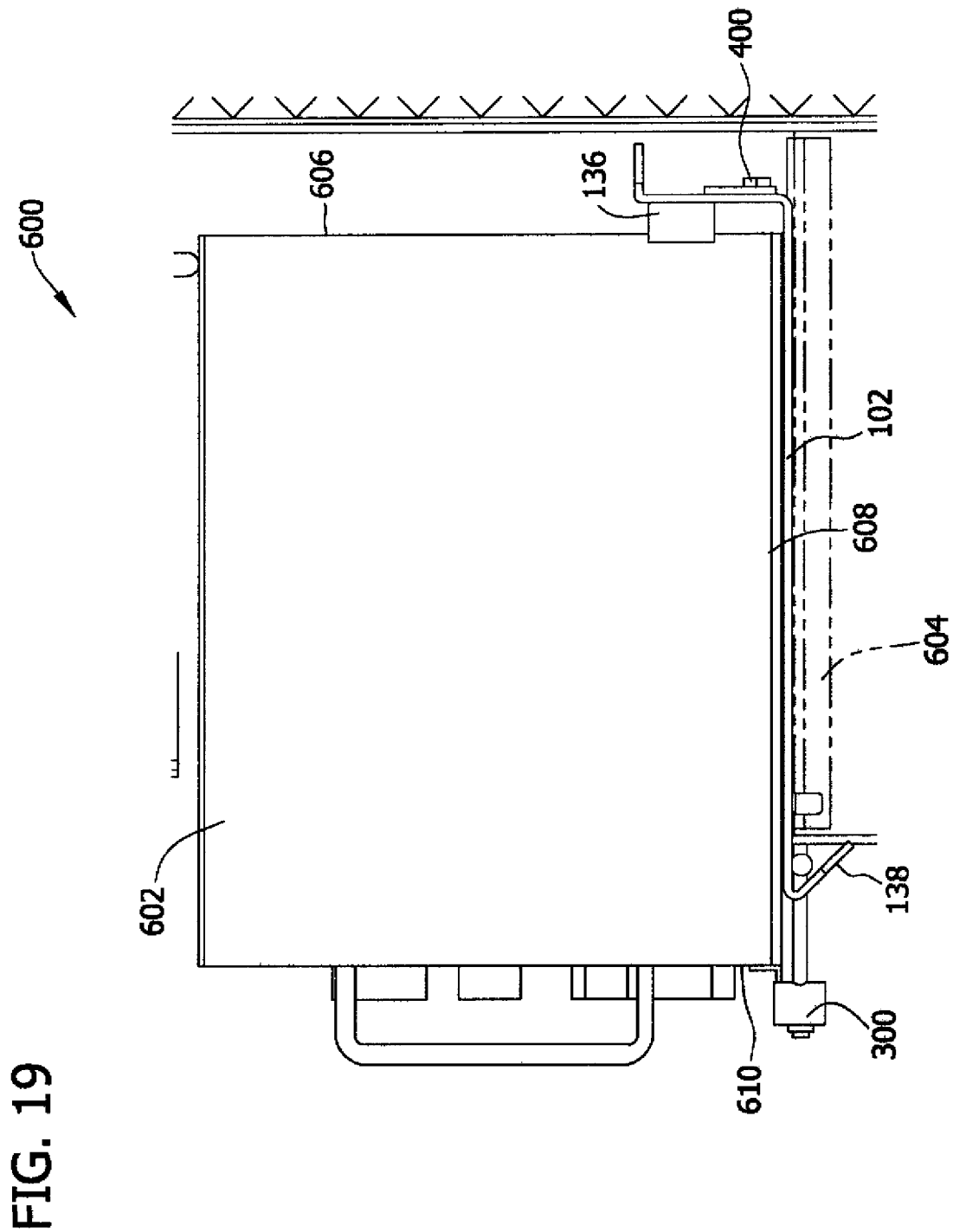
FIG. 19 is a side view of the mounting apparatus shown in FIG. 17.

FIG. 17-19 are schematic diagrams of an exemplary mounting apparatus 600 for use in mounting electronic components 602. Specifically, FIG. 17 is a perspective view of mounting apparatus 600, FIG. 18 is a front view of mounting apparatus 600 including electronic components 602 mounted thereon, and FIG. 19 is a side view of mounting apparatus 600 including electronic components 602 mounted thereon.

Figure 20:
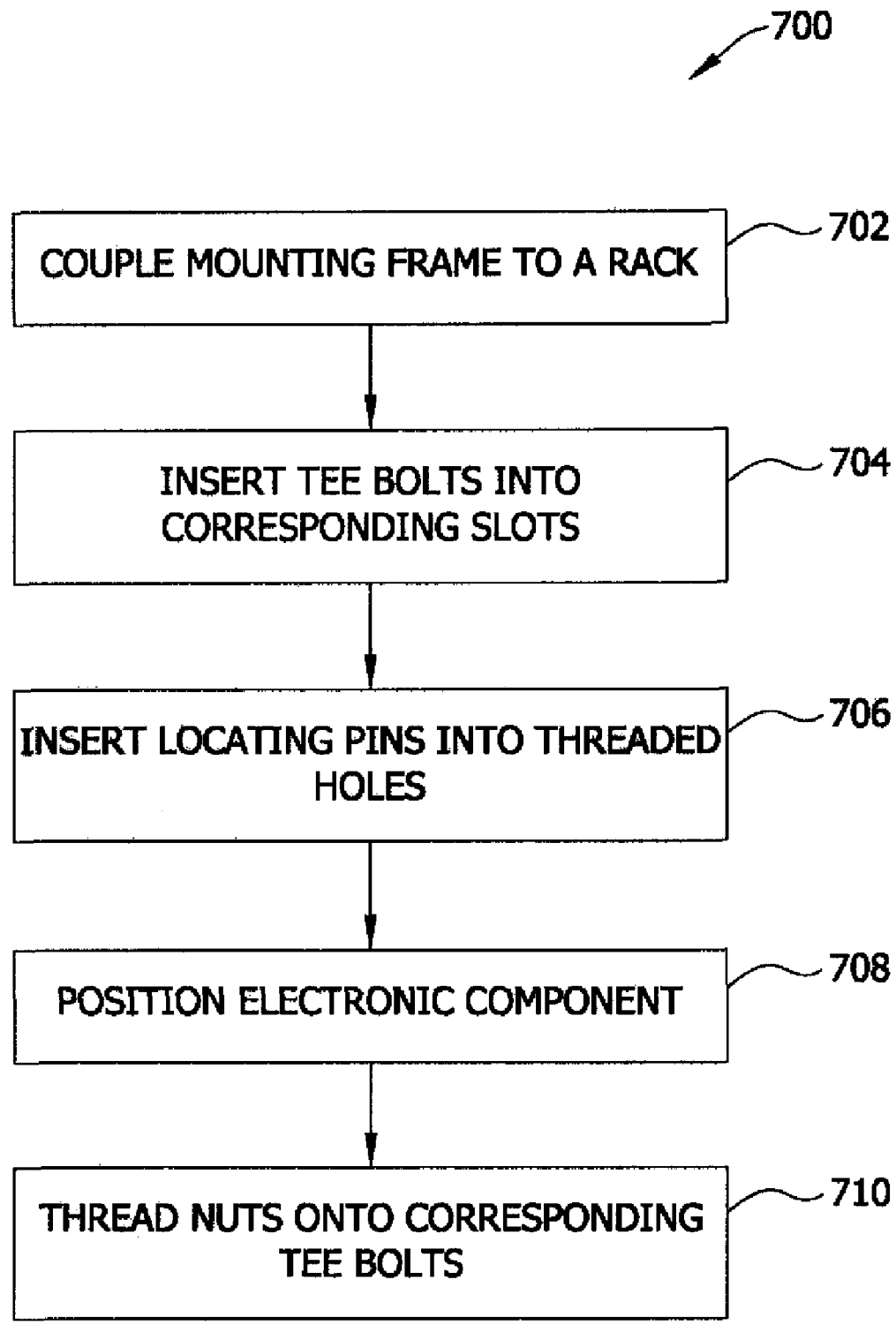
FIG. 20 is a flowchart illustrating an exemplary method of assembling the mounting apparatus shown in FIGS. 14-19.

FIG. 20 is a flowchart illustrating an exemplary method 700 of assembling mounting apparatus 600 for use in mounting electronic components 602 (shown in FIGS. 17-19). In the exemplary embodiment, mounting frame 100 is coupled 702 to a rack 604 (shown in FIG. 19) that is positioned in an equipment storage area (not shown). Specifically, mounting holes 118 in support portion 102 are substantially concentrically aligned with corresponding mounting holes (not shown) defined in the rack. In one embodiment, mounting frame 102 may be secured to rack 604 using bolts. Alternative embodiments may use any suitable means of securing mounting frame 102 to rack 604. Tee bolt first portion 202 is then inserted 704 into a corresponding slot 154 in mounting frame 100. Specifically, tee bolt first portion 202 is oriented substantially vertically to facilitate first portion 202 being inserted into a corresponding slot 154. A plurality of tee bolts 200 may be required to support and/or to stabilize a single electronic component 602.

Locating pin first end 402 is then inserted 706, such as threaded, into a corresponding backing portion hole 134. Specifically, locating pin first end 402 is threaded into a corresponding backing portion hole 134 from backing portion second segment front surface 130 toward backing portion second segment rear surface 132. In the exemplary embodiment, locating pin first end 402 is threaded into a backing portion hole 134 that is substantially aligned with slot 154 into which tee bolt first portion 202 was inserted. A plurality of locating pins 400 may be required to support and/or stabilize a single electronic component 602.

When an appropriate number of tee bolts 200 and locating pins 400 have been inserted into mounting frame 100, electronic component 602 is positioned 708. Specifically, electronic component 602 is positioned such that a rear surface 606 (shown in FIG. 19) of electronic component 602 contacts second end tip 406 of the inserted locating pins 400. In one embodiment, electronic component rear surface 606 also contacts compression material 136 to facilitate reducing vibrational stresses induced to electronic component 602. Moreover, in the exemplary embodiment, electronic component 602 is positioned such that a securing hole (not shown) formed in an electronic component bottom surface 608 (shown in FIG. 19) is aligned to receive tee bolt first portion top surface 208. Some electronic components 602 may require a plurality of tee bolts 200. As such, each tee bolt first portion top surface 208 is aligned to be inserted into a corresponding securing hole in electronic component bottom surface.

To further secure electronic component 602, nut 300 is coupled 710, such as threadably coupled, to threaded tee bolt second portion second end 218. As shown in FIG. 19, nut 300 is threaded onto tee bolt second portion second end 218 until contact is made between nut first end 306 and a front surface 610 of electronic component 602 to facilitate securing electronic component 602 on mounting frame 100. Some electronic components 602 may require a plurality of tee bolts 200. As such, a corresponding number of nuts 300 are used to facilitate securing electronic component 602 on mounting frame 100.

In an alternative embodiment, mounting bracket 502 (shown in FIGS. 14-16) is coupled to support portion 102 by inserting, such as threading, a fastener, such as a bolt, through mounting plate 520 (shown in FIG. 14). Specifically, a fastener is inserted rough a mounting plate hole 522 (shown in FIG. 14) and through an aligned mounting hole 118 in support portion 102 and is secured by, for example, a nut. Moreover, bracket 502 is coupled to backing portion 120. Specifically, a fastener, such as a bolt, is inserted, such as threaded, through mounting hole 518 (shown in FIG. 15) extending through rear wall 504 and through an aligned threaded hole 134, wherein the fastener is secured by, for example, a nut. Electronic component rear surface 606 is then positioned against rear wall 504. In addition, electronic component 602 is secured in such a position by each of first and second side rails 506 and 508 both shown in FIG. 16) that are positioned on opposite sides of electronic component 602. Electronic component bottom surface 608 and electronic component front surface 610 are then secured as described above.

To remove electronic component 602 for service or to accommodate additional electronic components 602, the above order of steps is reversed. Specifically, each nut 300 is uncoupled, such as unthreaded, from a corresponding tee bolt 200. Electronic component 502 is then removed for service or to enable removal of each tee bolt 200 and locating pin 400. After service is complete, the above-described steps are repeated.

The above-described apparatus and method facilitate mounting a varied quantity, size, and/or location of electronic components. The plurality of slots and threaded holes within the backing portion of the mounting frame facilitate accommodating the varied electronic components through the use of removable and universal mounting hardware, such as tee bolts, nuts, and locating pins. Using a common mounting hardware for all electronic components facilitates cost savings with respect to manufacturing, storage, and service. Manufacturing costs are reduced because installation of the above-described apparatus does not require welding particular mounting hardware for each electronic component to a rack. Storage costs are reduced due to a lower need to store the particular mounting hardware for each electronic component. Service costs are reduced because electronic components may be added and/or removed from the above-described apparatus without requiring a new mounting frame to be installed.

While the invention has been described in terms of various specific embodiments, those skilled in the art will recognize that the invention can be practiced with modification within the spirit and scope of the claims.

What is claimed is:

1. A mounting apparatus for electronic components, said mounting apparatus comprising:
    a mounting frame comprising:
        a support portion comprising a front end and an opposite rear end;
        a backing portion coupled to said support portion rear end, said backing portion comprises a first segment and a second segment, said second segment is oriented perpendicularly to said support portion and said first segment, and said second segment comprises a plurality of threaded holes extending therethrough; and
        a lip portion coupled to said support portion front end, wherein said support portion and said lip portion define a plurality of slots extending therethrough;
    a plurality of tee bolts, each of said plurality of tee bolts comprises a first portion and a second portion extending perpendicularly through said first portion, said first portion is removably inserted in one of said plurality of slots; and
    a plurality of locating pins, each of said plurality of locating pins comprises a first end removably inserted into one of said plurality of threaded holes extending through said backing portion second segment.

2. A mounting apparatus in accordance with claim 1, wherein said support portion, said backing portion, and said lip portion are integrally formed together.

3. A mounting apparatus in accordance with claim 1, wherein a top surface of each said tee bolt first portion is removably inserted into a securing hole defined at least partially in a corresponding electrical component to facilitate securing a position of the corresponding electrical component.

4. A mounting apparatus in accordance with claim 1, wherein each said tee bolt second portion comprises a first end comprising a bolt head.

5. A mounting apparatus in accordance with claim 4, wherein each said tee bolt second portion comprises a second end opposite said first end, wherein said second end is threaded to facilitate removably coupling said tee bolt to a corresponding nut of said plurality of nuts.

6. A mounting apparatus in accordance with claim 1 further comprising a plurality of nuts sized and threaded to be removably coupled to a corresponding tee bolt of said plurality of tee bolts.

7. A mounting apparatus in accordance with claim 1, wherein each locating pin of said plurality of locating pins further comprises a second end opposite said locating pin first end, wherein said second end defines a tip for contacting a rear surface of a corresponding electronic component.

8. A mounting apparatus in accordance with claim 1, wherein said backing portion further comprises a compression material.

9. A mounting apparatus in accordance with claim 1, wherein said support portion further comprises a plurality of mounting holes to facilitate securing said mounting apparatus to a rack.

10. A mounting apparatus in accordance with claim 1, further comprising a mounting bracket coupled to at least one of said support portion and said backing portion, said mounting bracket oriented perpendicular to said support portion.

11. A mounting apparatus in accordance with claim 10, wherein said mounting bracket comprises a rear wall and at least one side rail to facilitate securing a rear surface of the corresponding electrical component.

12. A method of assembling a mounting apparatus for use with electronic components, said method comprising:
coupling a backing portion of a mounting frame to a rear end of a support portion of the mounting frame, wherein the backing portion includes a first segment and a second segment that is oriented perpendicularly to the support portion and to the first segment;
inserting a tee bolt first portion into a slot defined in a lip portion of the mounting frame; and
inserting a locating pin first end into a corresponding threaded hole extending through the second segment of the backing portion.

13. A method in accordance with claim 12, wherein inserting a tee bolt first portion comprises inserting a top surface of the tee bolt first portion into a securing hole defined at least partially in an electrical component to facilitate securing a position of the electrical component.

14. A method in accordance with claim 12, further comprising coupling a threaded nut to a second portion of the tee bolt.

15. A method in accordance with claim 12, further comprising coupling a mounting bracket to at least one of the backing portion and the support portion, wherein the mounting bracket includes a rear wall and at least one side rail to facilitate securing a rear surface of the electrical component.

16. A mounting apparatus for supporting electronic components, said mounting apparatus comprising:
a mounting frame comprising:
a support portion comprising a front end, an opposite rear end, and a plurality of mounting holes extending through said support portion to facilitate securing said mounting apparatus to a rack;
a backing portion formed integrally with said support portion rear end, said backing portion comprises a first segment and a second segment, said second segment is oriented perpendicular to said support portion and to said first segment, said second segment comprises a plurality of threaded holes extending therethrough and a compression material; and
a lip portion formed integrally with said support portion front end, said support portion and said lip portion define a plurality of slots extending therethrough;
a plurality of tee bolts, each of said plurality of tee bolts comprises a first portion and a second portion extending perpendicularly through said first portion, said first portion is removably inserted in one of said plurality of slots; and
a plurality of locating pins, each of said plurality of locating pins comprises a first end removably inserted in one of said plurality of threaded holes extending through said backing portion second segment.

17. A mounting apparatus in accordance with claim 16, wherein a top surface of each of said tee bolt first portions is removably inserted in a securing hole extending at least partially into a corresponding electrical component to facilitate securing a position of the corresponding electrical component.

18. A mounting apparatus in accordance with claim 16, further comprising a plurality of nuts threadedly coupled to one of said plurality of tee bolts, each said tee bolt second portion comprises a second end that is opposite said first end, said second end facilitates removably coupling said tee bolt to one of said plurality of nuts.

19. A mounting apparatus in accordance with claim 16, wherein each of said plurality of locating pins further comprises a second end that is opposite said first end, said second end defines a tip for contacting a rear surface of a corresponding electronic component.

20. A mounting apparatus in accordance with claim 16, further comprising a mounting bracket coupled to at least one of said support portion and said backing portion, said mounting bracket oriented perpendicular to said support portion, said mounting bracket comprising a rear wall and at least one side rail to facilitate securing a rear surface of the corresponding electrical component.

\* \* \* \* \*